United States Patent
Nishikawa et al.

(10) Patent No.: US 10,598,702 B2
(45) Date of Patent: Mar. 24, 2020

(54) SIMILARITY DETECTION OF ABNORMAL WAVEFORMS USING PMU MEASUREMENT

(71) Applicant: Hitachi, Ltd., Tokyo (JP)

(72) Inventors: Norifumi Nishikawa, Santa Clara, CA (US); Jun Yamazaki, Santa Clara, CA (US); Mika Takata, Santa Clara, CA (US)

(73) Assignee: Hitachi, Ltd., Tokyo (JP)

( * ) Notice: Subject to any disclaimer, the term of this patent is extended or adjusted under 35 U.S.C. 154(b) by 104 days.

(21) Appl. No.: 16/075,401

(22) PCT Filed: May 13, 2016

(86) PCT No.: PCT/US2016/032523
§ 371 (c)(1),
(2) Date: Aug. 3, 2018

(87) PCT Pub. No.: WO2017/196374
PCT Pub. Date: Nov. 16, 2017

(65) Prior Publication Data
US 2019/0056436 A1 Feb. 21, 2019

(51) Int. Cl.
*G01R 19/00* (2006.01)
*G01R 19/25* (2006.01)

(52) U.S. Cl.
CPC ........ *G01R 19/2513* (2013.01); *Y02E 60/728* (2013.01); *Y04S 10/265* (2013.01)

(58) Field of Classification Search
USPC ................................. 324/713, 650, 86, 76.83
See application file for complete search history.

(56) References Cited

U.S. PATENT DOCUMENTS

| | | |
|---|---|---|
| 2007/0150114 A1 | 6/2007 | Gardner et al. |
| 2008/0262758 A1 | 10/2008 | Rehtanz et al. |
| 2009/0089608 A1 | 4/2009 | Guzman-Casillas |
| 2012/0209654 A1 | 8/2012 | Romagnino et al. |
| 2014/0324369 A1 | 10/2014 | Yang et al. |
| 2015/0121160 A1* | 4/2015 | Baone ............... G06Q 50/06 714/746 |

* cited by examiner

*Primary Examiner* — Vincent Q Nguyen
(74) *Attorney, Agent, or Firm* — Procopio, Cory, Hargreaves & Savitch LLP

(57) ABSTRACT

Example implementations described herein are directed to detection of historical anomalous events that are similar to currently occurring events in a transmission power system based on phasor management unit (PMU) data to provide information to grid operators with online decision support. From the high-resolution time synchronized PMU data, the historical events can be quickly retrieved and compared to the currently occurring event so that operators can be provided with remedy actions that were attempted in response to the historical events. Utilization of PMU information for such decision support may compliment operation practices relying on supervisory control and data acquisition (SCADA) measurements by allowing a much fast response to the currently occurring event. Accurate identification of similar, historical events can advise grid operators of the cause of disturbances and provide ideas for response. Implementations of the proposed technology may improve the resilience and reliability of the transmission power systems.

15 Claims, 16 Drawing Sheets

400

| Time stamp 405 | PMU_id 410 | Area_id 415 | frequency 420 | voltage 425 | active power 430 | angle 435 | current 440 | reactive power 445 | ROCOF 450 |
|---|---|---|---|---|---|---|---|---|---|
| Mar. 27 14:00:00.000 | PMU1 | Area432 | 60.001 | 502.333 | 2048.250 | 18.3 | 4.08 | 120.18 | 0.12 |
| Mar. 27 14:00:00.000 | PMU2 | Area432 | 60.001 | 504.235 | 1024.331 | 11.5 | 2.03 | 85.14 | 0.11 |
| Mar. 27 14:00:00.033 | PMU1 | Area432 | 60.002 | 501.104 | 2023.330 | 18.4 | 4.04 | 125.69 | 0.03 |
| Mar. 27 14:00:00.033 | PMU2 | Area432 | 60.002 | 503.331 | 1025.253 | 11.6 | 2.04 | 102.33 | 0.03 |
| Mar. 27 14:00:00.066 | PMU1 | Area432 | 59.301 | 520.001 | 522.265 | 25.3 | 1.00 | 116.29 | -21.24 |
| Mar. 27 14:00:00.066 | PMU2 | Area432 | 59.300 | 502.307 | 1523.236 | 23.8 | 3.03 | 96.71 | -21.27 |

| Row# 505 | value 510 | timestamp 515 | Item_id* 520 |
|---|---|---|---|
| 1 | 60.001 | Mar. 27 14:00:00.000 | PMU1-freqeuncy |
| 2 | 60.002 | Mar. 27 14:00:00.033 | PMU1-freqeuncy |
| 3 | 59.301 | Mar. 27 14:00:00.066 | PMU1-freqeuncy |
| 4 | 60.013 | Mar. 27 14:00:00.099 | PMU1-freqeuncy |
| 5 | 60.003 | Mar. 27 14:00:00.100 | PMU1-freqeuncy |
| 6 | 502.333 | Mar. 27 14:00:00.000 | PMU1-voltage |
| 7 | 501.104 | Mar. 27 14:00:00.033 | PMU1-voltage |
| 8 | 520.001 | Mar. 27 14:00:00.066 | PMU1-voltage |
| 9 | 504.002 | Mar. 27 14:00:00.099 | PMU1-voltage |
| 10 | 502.325 | Mar. 27 14:00:00.100 | PMU1-voltage |
| 11 | 2048.250 | Mar. 27 14:00:00.000 | PMU1-power |
| 12 | 2023.330 | Mar. 27 14:00:00.033 | PMU1-power |
| 13 | 522.265 | Mar. 27 14:00:00.066 | PMU1-power |
| 14 | 528.024 | Mar. 27 14:00:00.099 | PMU1-power |
| 15 | 530.198 | Mar. 27 14:00:00.100 | PMU1-power |

| Type | Min% | Max% | Base value | Related_item id |
|---|---|---|---|---|
| Voltage | 10 | 10 | 500 | PMU1-voltage |
| Voltage | 10 | 10 | 230 | PMU2-voltage |
| frequency | 3 | 3 | 60 | PMU1-frequency, PMU2-frequency |

| Minimum Event Duration | Duration Preceding Event ($t_1$) | Duration Following Event ($t_2$) |
|---|---|---|
| 60 s | 30 s | 15 s |

| Time stamp | PMU_id | frequency | voltage |
|---|---|---|---|
| Mar. 27 14:00:00.000 | PMU1 | 60.001 | 502.333 |
| Mar. 27 14:00:00.033 | PMU1 | 60.002 | 501.104 |
| Mar. 27 14:00:00.066 | PMU1 | 59.301 | 520.001 |
| Mar. 27 14:00:00.000 | PMU2 | 60.001 | 504.235 |
| Mar. 27 14:00:00.033 | PMU2 | 60.002 | 503.331 |
| Mar. 27 14:00:00.066 | PMU2 | 59.300 | 502.307 |

|  | PMU1 | PMU2 | PMU3 |
|---|---|---|---|
| PMU1 |  | 10 | 20 |
| PMU2 | 10 |  | 15 |
| PMU3 | 20 | 15 |  |

|  | Area1 | Area2 | Area3 |
|---|---|---|---|
| Area1 |  | 110 | 205 |
| Area2 | 110 |  | 157 |
| Area3 | 205 | 157 |  |

| Data type (1105) | Correlated data type (1110) |
|---|---|
| Frequency | Frequency, ROCOF |
| Voltage | Voltage, reactive power |
| angle | angle, active power |

| Timestamp (1205) | item_id (1210) |
|---|---|
| Mar. 27 14:00:00.000 | PMU2-voltage |
| Mar. 27 14:00:00.000 | PMU1-voltage |

| Timestamp (1305) | item_id (1310) |
|---|---|
| Mar. 27 14:00:00.000 | PMU1-freqeuncy<br>PMU1-voltage<br>PMU2-voltage |
| Mar. 27 14:02:14.066 | PMU2-voltage<br>PMU2-voltage<br>PMU3-power |

FIG. 13

SIMILARITY DETECTION OF ABNORMAL WAVEFORMS USING PMU MEASUREMENT

BACKGROUND

Field

The present disclosure relates to power systems, and more specifically, to management of power system events through phasor measurement units (PMUs).

Related Art

In the related art implementations, PMUs are used to monitor the power grid and provide real time feedback regarding power system disturbances. With high resolution, time-synchronized sensing schemes, PMUs can capture power system dynamics and transient switching events, such as line reclosing and breaker switching, the majority of which take place autonomously and may not be recorded. In the related art, use of PMUs throughout a power system may cause power operators to be inundated by massive amounts of data, which may prevent them from recognizing critical grid information or abnormal behavior and responding in a timely manner. For example, the use of PMUs monitoring a power grid can produce data volumes 100 to 1000 times larger than typically handled by related art supervisory control and data acquisition (SCADA) systems used to remotely monitor and control facilities.

Further, in some related art implementations, searching a PMU database of past similar events may be used to help determine a power grid operator's action in response to a fault occurring in the power grid. In one related art system, each data waveform sequence associated with an event in a database is segmented at multiple resolution levels and then clustered with a label name to create feature values in advance of receiving a newly detected event. When a new event occurs, the user inputs a sequence associated with the new event as a key for a similarity search. This input sequence is segmented and labeled for comparison to the pre-created sequences. If all of the resolution levels of the input sequence match the label of the pre-created segments, the sequences in the pre-created segments will be returned as the search result.

In other related art implementation, known or predefined event information is calculated and added to stored wave form data in a database in a batch mode. This event information contains an event name and a waveform id (e.g., a metric id) and time stamps defining when an event occurred. When a new waveform arrives, the new wave form is checked to determine if the wave form contains any predefined events. If the new waveform contains any pre-defined events, event information can be retrieved from the database using the event name, and waveform data related to the event can be retrieved using the stored waveform id and timestamps.

However, these related art systems require significant Central Processing Unit (CPU) and input/output (I/O) resources to create the feature values from the data in large databases. In systems with new data being continuously received (e.g., streaming data such as a PMU database) obtaining sufficient computing resources to calculate feature values may be technically infeasible or cost prohibitive. For example, the computational time required to calculate feature values may exceed tens of milliseconds, or even a full second, which is infeasible when processing multiple incoming data streams from PMUs distributed within a power grid.

Further, these related art systems are unable to detect similar events that have not been predefined. With power distribution systems it is not always possible to pre-define events because many power system events can be caused by natural phenomena (e.g., storms, heat induced brown outs, etc.).

SUMMARY

There is a need for a system and method to quickly identify "events" from historical PMU database data similar to an "event" detected in incoming PMU data without relying on pre-defined feature values or a pre-defined event information index. Such "events" are not caused by normal load and generation variations, so that operators can be alerted early on and can take remedy actions in time. Such a system should allow an operator to retrieve data about similar events immediately after the new event data arrives even if the new event data is not pre-defined or is first occurrence event. Additionally, the CPU costs of feature extraction should be avoided to enable retrieval of similar events even from data being stored continuously into a database.

Example implementations of the present disclosure involve systems and methods to detect an occurring event, retrieve similar event data from a PMU database, correlate the retrieved similar event data with the occurring event data using waveform correlation and based on the correlation recommending actions responsive to the occurring event.

Aspects of the present disclosure also include a system configured to manage one or more phasor measurement units (PMUs). The system can involve a memory configured to store measurement data from the one or more PMUs, the measurement data comprising first measurement data including at least one of frequency data and voltage data, and second measurement data; and a processor. The processor can be configured to: for an instance of the first measurement data being outside a threshold: identify a corresponding PMU from the one or more PMUs associated with the instance; and capture, based on the instance, a first window of the first measurement data and the second measurement data of the corresponding PMU; process incoming data from the one or more PMUs; for a second window of the incoming data corresponding to the first window, retrieve the first measurement data and the second measurement data corresponding with the instance; and conduct a comparison between the first window of the first measurement data and the second measurement data, and the second window of the incoming data.

Aspects of the present disclosure also include a method of managing one or more PMUs, the method can involve storing measurement data from the one or more PMUs, the measurement data comprising first measurement data including at least one of frequency data and voltage data, and second measurement data; and for an instance of the first measurement data being outside a threshold: identifying a corresponding PMU from the one or more PMUs associated with the instance; and capturing, based on the instance, a first window of the first measurement data and the second measurement data of the corresponding PMU; processing incoming data from the one or more PMUs; for a second window of the incoming data corresponding to the first window, retrieving the first measurement data and the second measurement data corresponding with the instance; and conducting a comparison between the first window of the first measurement data and the second measurement data, and the second window of the incoming data.

Aspects of the present disclosure further include a non-transitory computer readable medium storing instructions for managing one or more phasor measurement units (PMUs). The instructions may involve storing measurement data from the one or more PMUs, the measurement data comprising first measurement data including at least one of frequency data and voltage data, and second measurement data; and for an instance of the first measurement data being outside a threshold: identifying a corresponding PMU from the one or more PMUs associated with the instance; and capturing, based on the instance, a first window of the first measurement data and the second measurement data of the corresponding PMU; processing incoming data from the one or more PMUs; for a second window of the incoming data corresponding to the first window, retrieving the first measurement data and the second measurement data corresponding with the instance; and conducting a comparison between the first window of the first measurement data and the second measurement data and the second window of the incoming data.

Aspects of the present disclosure further include an apparatus configured to manage one or more phasor measurement units (PMUs). The apparatus can involve means for storing measurement data from the one or more PMUs, the measurement data comprising first measurement data including at least one of frequency data and voltage data, and second measurement data; and for an instance of the first measurement data being outside a threshold, means for identifying a corresponding PMU from the one or more PMUs associated with the instance; and means for capturing, based on the instance, a first window of the first measurement data and the second measurement data of the corresponding PMU; means for processing incoming data from the one or more PMUs; for a second window of the incoming data corresponding to the first window, means for retrieving the first measurement data and the second measurement data corresponding with the instance; and means for conducting a comparison between the first window of the first measurement data and the second measurement data, and the second window of the incoming data.

BRIEF DESCRIPTION OF DESCRIPTION

FIG. 4 illustrates a data table representative of PMU data in communication format in accordance with an example implementation.

FIG. 5 illustrates a data table representative of PMU data in a storage format for in accordance with an example implementation.

FIG. 6 illustrates a data table representative of filter values in accordance with an example implementation.

FIG. 7 illustrates a data table representative of settings used to define a window of data to be retrieved in accordance with an example implementation.

FIG. 8 illustrates a data table representative of search key data extracted from a PMU database in accordance with an example implementation.

FIG. 9 illustrates a distance correspondence table representative of the physical distance between different PMUs in a power grid in accordance with an example implementation.

FIG. 10 illustrates a distance correspondence table representative of the physical distance between different geographic areas serviced by various PMUs in a power grid in accordance with an example implementation.

FIG. 11 illustrates a data type correspondence table in accordance with an example implementation.

FIG. 12 illustrates an event candidate table generated in accordance with an example implementation.

FIG. 13 illustrates another event candidate table generated in accordance with an example implementation.

DETAILED DESCRIPTION

Figure 1:
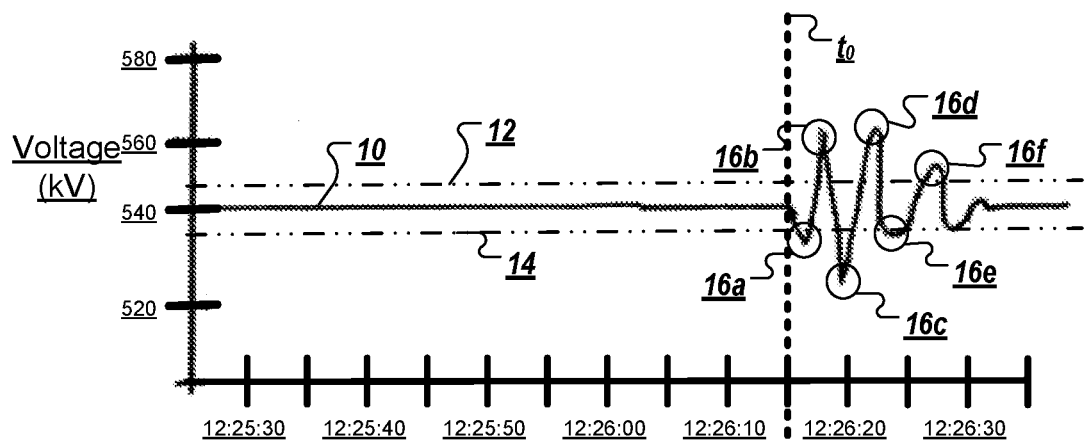
FIG. 1 illustrates an example waveform representative of data received from a PMU in accordance with an example implementation.

The following detailed description provides further details of the figures and example implementations of the present application. Reference numerals and descriptions of redundant elements between figures are omitted for clarity. Terms used throughout the description are provided as examples and are not intended to be limiting. For example, the use of the term "automatic" may involve fully automatic or semi-automatic implementations involving user or administrator control over certain aspects of the implementation, depending on the desired implementation of one of ordinary skill in the art practicing implementations of the present application.

Example implementations involve a method to detect anomalies or events in incoming PMU data and identify similar anomalies or events from historical PMU data, which can be implemented as a similar event detection module. The anomalies may arise from various power system events, such as transient phenomena (usually lasting less than one second) introduced by line breaker operation, reclosing, and faults, as well as steady state changes (lasting on the order of seconds) from topology and power flow variations. Our method is robust, fast, and scalable, making it suitable for use in real-time detection.

The input to the similar event detection module is a set of time series data collected by PMUs. The basic series are frequency, voltage, and power data, reported at a fixed sample rate, such as 30 Hz. In some implementations, current data may alternatively be reported and power data calculated based on the received voltage and current data. The data may be historical, streaming, or both.

Figure 2:
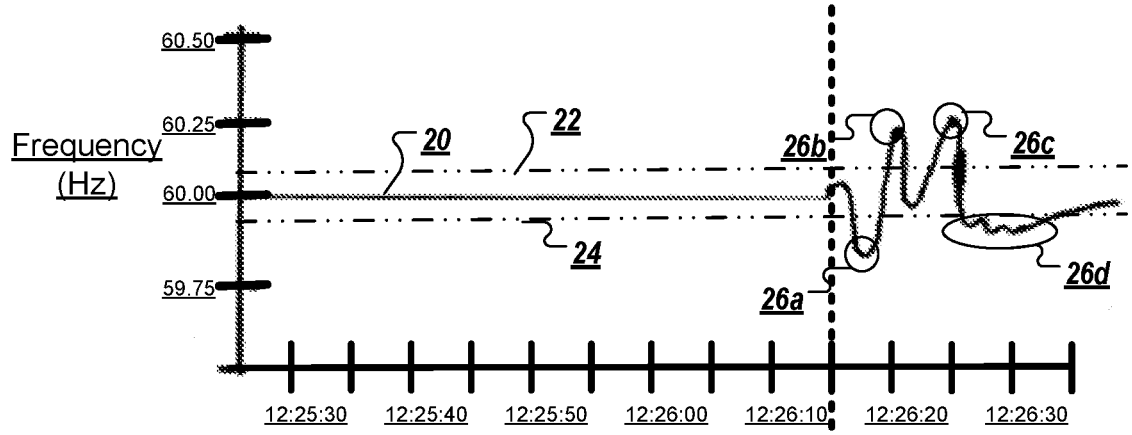
FIG. 2 illustrates an example waveform representative of data received from a PMU in accordance with an example implementation.
Figure 3:
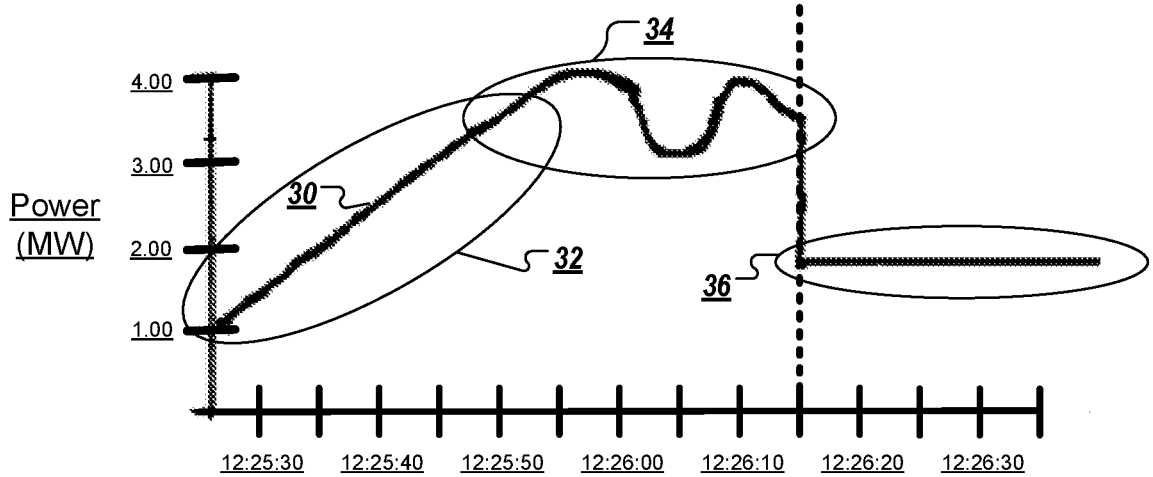
FIG. 3 illustrates an example waveform representative of data received from a PMU in accordance with an example implementation.

To allow visualization anomalies, the data received may be plotted over time to produce a waveform representative of the received data. FIGS. 1-3 illustrate example waveforms representative of data received from a PMU in accordance with an example implementation. FIG. 1 illustrates a plot 10 of received voltage data at different time intervals. Reference lines 12 and 14 representative of maximum and minimum threshold values of voltage may also be plotted with the received voltage data. The threshold values may be used to identify outlier values that can be used to detect potential events in the received voltage data. As illustrated in FIG. 1, some event may have occurred at $t_0$ (12:26:15) causing outliers 16a-16f where the voltage values of the received data is either above (16b, 16d, 16f) or below (16a, 16c, 16e) the threshold reference lines 12, 14. As discussed below, detection of these outliers (16a-16f) may be used to identify similar events in historical PMU data automatically.

FIG. 2 illustrates a plot 20 of received frequency data at different time intervals. Reference lines 22 and 24 representative of maximum and minimum threshold values of frequency may also be plotted with the received frequency data. The threshold values may be used to identify outlier values that can be used to detect potential events in the received frequency data. As illustrated in FIG. 2, some event may have occurred at $t_0$ (12:26:15) causing outliers 26a-26d where the frequency values of the received data is either above (26b, 26c) or below (26a, 16d) the threshold reference lines 22, 24. As discussed below, detection of these outliers (26a-26d) may be used to identify similar events in historical PMU data automatically.

FIG. 3 illustrates a plot 30 of received power data at different time intervals. As illustrated, the power data may have a region 32 of power ramp-up where the power is increasing to an operating range based on the load being experienced. Additionally, the power data may illustrate one or more operating regions 34, where the power fluctuates over time during normal operation. As illustrated in FIG. 3, some event may have occurred at $t_0$ (12:26:15) and caused the power data plot 30 to drop below the region 34 of normal operation. In the depressed region 36, the power has dropped significantly following the event at $t_0$. As discussed in greater detail below, the frequency and voltage data are relative constant during normal operation, allowing recognition of outliers to be used to identify events. Conversely, power data values can fluctuate widely during normal operation, making it difficult to detect outliers indicative of events based on power data.

FIG. 4 illustrates a data table 400 representative of PMU data in communication format received from each PMU in accordance with an example implementation. Each row in the data table 400 is representative of all data received from a specific PMU at a specific moment of time and includes 10 columns of information. Column 405 is representative of the time stamp associated with the received data. Column 410 is representative of the PMU_id associated with the PMU from which the data was received. Column 415 is representative of the geographic area associated with the PMU from which the data was received. Column 420 is representative of a frequency data value measured by the PMU. Column 425 is representative of a voltage data value measured by the PMU. Column 430 is representative of an active power data value measured by the PMU. Column 435 is representative of a current angle value measured by the PMU. Column 440 is representative of a current magnitude data value measured by the PMU. Column 445 is representative of a reactive power data value measured by the PMU. Column 450 is representative of a rate of change of frequency (ROCOF) data value calculated by the PMU or the system based on the other data received from the PMU.

FIG. 5 illustrates a data table 500 representative of PMU data converted from the communication format of FIG. 4 to a storage format for storage to a database and processing by the similar event detection module in accordance with an example implementation. Each row in the data table 500 is representative of a single measurement value receive from a specific PMU at a specific moment of time and includes 4 columns of information. Column 505 is representative of a row number sequentially assigned to each row and used for cross-references and data handling. Column 510 is representative of a value of the measured data in a given row. The physical property (e.g. voltage, power, frequency) associated with each row may vary. For example, as illustrated row #1-5 contain frequency values and row #6-10 contain voltage values.

Column 515 is representative of the time stamp associated with the measured data in a given row. Column 520 is representative of an Item_id associated with the measured data in a given row. The Item_id is an identifier string generated by combining a PMU_ID associated with the measure data in a given row and physical property associated with the measured data in a given row (e.g. voltage, power, frequency). For example, in row #1 the Item_id may be the identifier string "PMU1-Frequency," which corresponds to the combination of "PMU1" and "Frequency." Thus, the Item_id in row #1 indicates that the value (Column 510) corresponds to frequency data from PMU1 captured at the timestamp (Column 515).

FIG. 6 illustrates a data table 600 representative of filter values stored in memory to be used by the similar event detection module in accordance with an example implementation. The filter values may correspond to threshold values used to identify outliers in received frequency and voltage data as discussed above with respect to FIGS. 1 and 2. Each row in the data table 600 is representative of a different filter value used to define a threshold for identifying an outlier in a received data associated with one physical property or PMU providing data. Column 605 is representative of the type of physical property associated with the filter value (e.g., Voltage, Frequency). Column 610 is representative of a percentage used, in combination with the base value discussed below (Column 620), to determine a minimum filter value, which may be used to identify outliers when the measured value falls below the minimum filter value. Column 615 is representative of a percentage used, in combination with the base value discussed below (Column 620), to determine a maximum filter value, which may be used to identify outliers when the measured value exceeds the maximum filter value. Column 620 is representative of a base value that is used in combination with the percentages of Columns 610 and 620 to determine the thresholds used to identify outliers in data. For example, an upper threshold value in the first row may correspond to 110% of the base value (e.g. 550 volts) and the lower threshold value in the first row may correspond to 90% of the base value (e.g. 450 volts).

Further, Column 625 is representative of the Item_id associated with the filter values of each row. As illustrated, different filter values may be used for the same physical property measured by different PMUs. For example, the base value associated with the voltage measured at PMU1 may be 500 volts, but the base value associated with the voltage measured at PMU2 may be 230 volts. Further, the same filter values may be used for the same physical property measured by different PMUs. For example, the base value associated with frequency measured at both PMU1 and PMU2 may be 60 Hz.

FIG. 7 illustrates a data table 700 representative of settings used to define a window of data to be retrieved from historical PMU data when identifying similar events in accordance with an example implementation. Column 705 is representative of a minimum event duration used to separate different events occurring in short duration. If multiple outliers are found within a time window corresponding to the minimum event duration of column 705, all outliers may be grouped and considered a single event. Conversely, multiple outliers separated by a time window exceeding the minimum event duration of column 705 may be treated as different events. The value of column 705 may be defined by a user, a system operation, or may be dynamically determined based on previously detected events.

Column 710 is representative of a time duration ($t_1$) preceding a detected event used to define a window of data to be extracted from historical PMU data to perform a similarity comparison between an occurring event and a similar event detected in the historical PMU data. Column 715 is representative of a time duration ($t_2$) following a detected event used to define a window of data to be extracted from historical PMU data to perform a similarity comparison between an occurring event and a similar event detected in the historical PMU data. The value of columns 710 and 715 may be defined by a user, a system operation, or may be dynamically determined based on a time window of data being displayed of an occurring event. Use of the time durations $t_1$ and $t_2$ to define the data windows will be discussed in greater detail below.

FIG. 8 illustrates a data table 800 representative of search key data extracted from a PMU database to identify outliers in historical data in accordance with an example implementation. The search key data is a window of data extracted from a PMU database to be used to identify outliers in historical PMU data. The size of the window of data may correspond to window size of data being received currently received by a PMU that is experiencing an occurring event.

Each row in the data table 800 is representative of different data set (e.g. a set of received data values) received from a single PMU at specific time. Column 805 is representative of a timestamp associated with the received data set in each row. Column 810 is representative of the PMU_id associated with the received data set. Column 815 is representative of a frequency value associated with the received data set. Column 820 is representative of a voltage value associated with the received data set. Usage of the data table 800 is discussed in greater detail below.

FIG. 9 illustrates a distance correspondence table 900 representative of the physical distance between different PMUs in a power grid. The table includes three PMUs with the PMU_ids associated with each PMU being provided in the top row and in the left most column. The remaining fields indicate a physical distance between the respective PMUs. For example, the distance between PMU1 and PMU2 is 10 km (the units of measurement are not particularly limited and are provided merely for illustration purposes).

FIG. 10 illustrates a distance correspondence table 1000 representative of the physical distance between different geographic areas serviced by various PMUs in a power grid. The table includes three areas with the Area_ids associated with each area being provided in the top row and in the left most column. The remaining fields indicate a physical distance between the respective geographic areas. For example, the distance between Area 1 and Area 2 is 110 km (the units of measurement are not particularly limited and are provided merely for illustration purposes).

FIG. 11 illustrates a data type correspondence table 1100 representative of the data types of physical properties that correlates with, or is dependent upon, another data type. In the table 1100, each row illustrates a different correspondence or relationship. Column 1105 is representative of a measured data type (e.g., Frequency, Voltage, and Angle). Column 1110 is representative of data types that can be correlated to the measured data type of Column 1105. For example, both frequency and ROCOF (Column 1110) can be correlated to measured frequency (Column 1105). Further, as illustrated, both voltage and reactive power (Column 1110) can be correlated to measured voltage (Column 1105). Additionally, angle and active power (Column 1110) can be correlated to measured angle (Column 1110).

FIG. 12 illustrates an event candidate table 1200 generated in accordance with an example implementation. Each row in the event candidate table 1200 corresponds to a different candidate event detected for use in performing a similarity match as discussed in greater detail below. Column 1205 of the event candidate table 1200 is representative of a timestamp associated with a candidate event. Column 1210 of the event candidate table 1200 is representative of an item_id (e.g., combination of the PMU_ID and measured quantity) associated with the candidate event. As illustrated in FIG. 12, the item_id column 1210 only includes one item_id for each timestamp or candidate event.

FIG. 13 illustrates another event candidate table 1300 generated in accordance with an example implementation. Each row in the event candidate table 1300 corresponds to a different candidate event detected for use in performing a similarity match as discussed in greater detail below. Column 1305 of the event candidate table 1300 is representative of a time stamp associated with a candidate event. Column 1310 of the event candidate table 1200 is representative of an item_id (e.g., combination of the PMU_ID and measured quantity) associated with the candidate event. As illustrated in FIG. 13, the item_id column 1310 includes multiple item_ids for each timestamp or candidate event.

Figure 14:
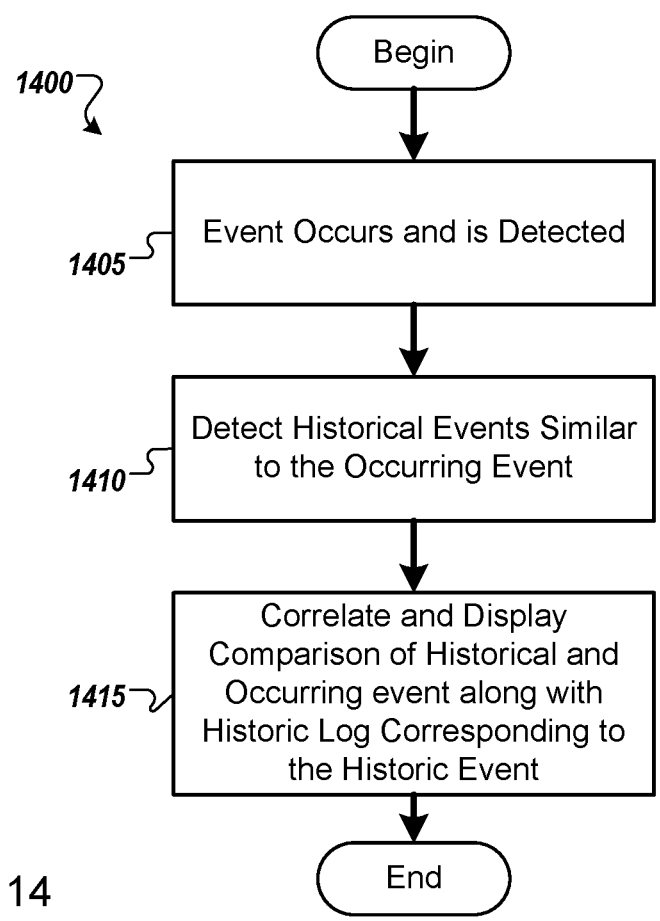
FIG. 14 illustrates a general process flow of providing action recommendations in response to a detected event in accordance with an example implementation.

FIG. 14 illustrates a general process flow 1400 of providing action recommendations in response to a detected event measured by a PMU located within a power grid in accordance with an example implementation. In the general process 1400, an event or anomaly occurs and is detected at 1405. The anomalies may arise from various power system events, such as transient phenomena (usually lasting less than one second) introduced by line breaker operation, reclosing, and faults, as well as steady state changes (lasting on the order of seconds) from topology and power flow variations.

The occurring event may be detected by determining that measured data associated with one or more of frequency and voltage is outside of normal range specified by filter values, such as those illustrated in FIG. 6 above. For example, an event may be detected by determining that measured data associated with voltage exceeds a specified base value (e.g., Col. 620) by more than a specified in max percentage (e.g., Column 615).

Once the occurring event is detected, a historical event similar to the occurring event is identified from a database of historical PMU data at 1410. As used herein the term "historical" merely refers to PMU data that was previously received and has been stored to a database for later use. The process of identifying the historical event is discussed in greater detail below with respect to FIGS. 15-21 and may be performed by the similar event detection module. The output of the similar event detection module may be a set of timestamps, and one or more item_ids at which historical anomalies have been detected, and associated measurement data indicative of the anomaly occurring. The output of the similar event detection module may also include similarity data numerically representing a degree of similarity between the historical event and the occurring event.

Figure 22:
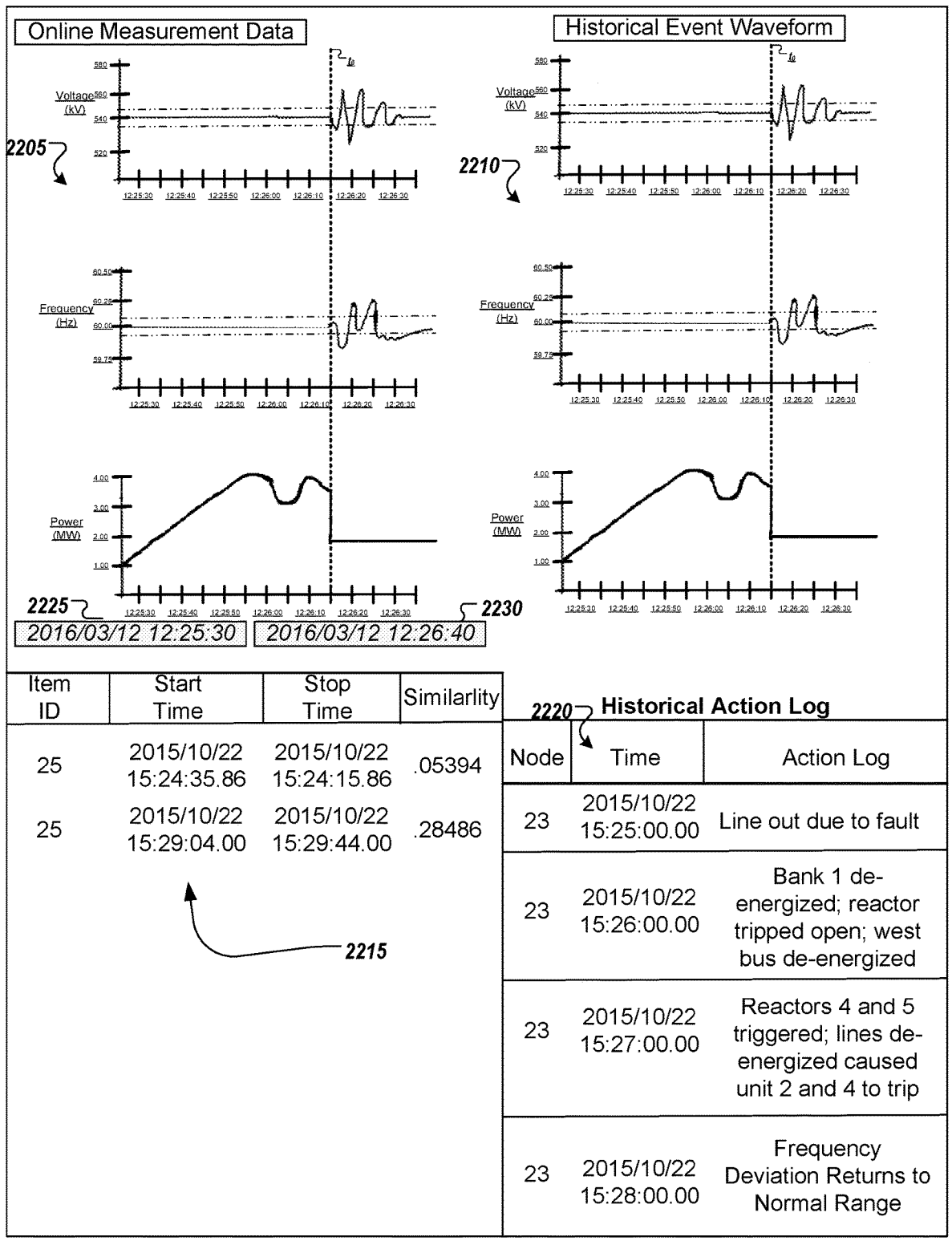
FIG. 22 illustrates a user interface displaying data relating to an occurring event and a retrieved historical event in accordance with an example implementation.

At 1415, the output of the similar event detection module may be used to correlate and display a comparison between the occurring event and the identified historical event. FIG. 22 discussed below illustrates an example implementation of the displayed comparison. Further, in addition to displaying a comparison between the occurring event and the identified historical event, a historic log of actions taken in response to the historic event, and the effect may be displayed. The displayed historic log may be used to recommend actions to be taken in response to the occurring event as discussed in greater detail below with respect to FIG. 22.

Figure 15:
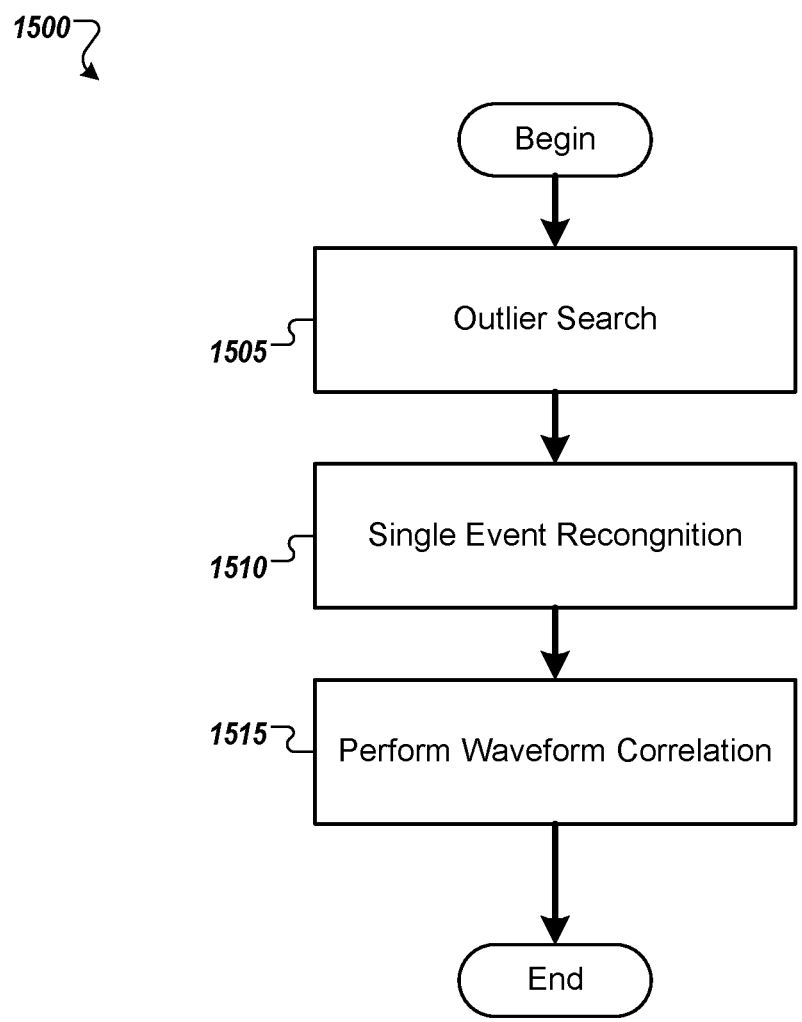
FIG. 15 illustrates a process flow for identifying the historical event from a PMU database in accordance with an example implementation.
Figure 16:
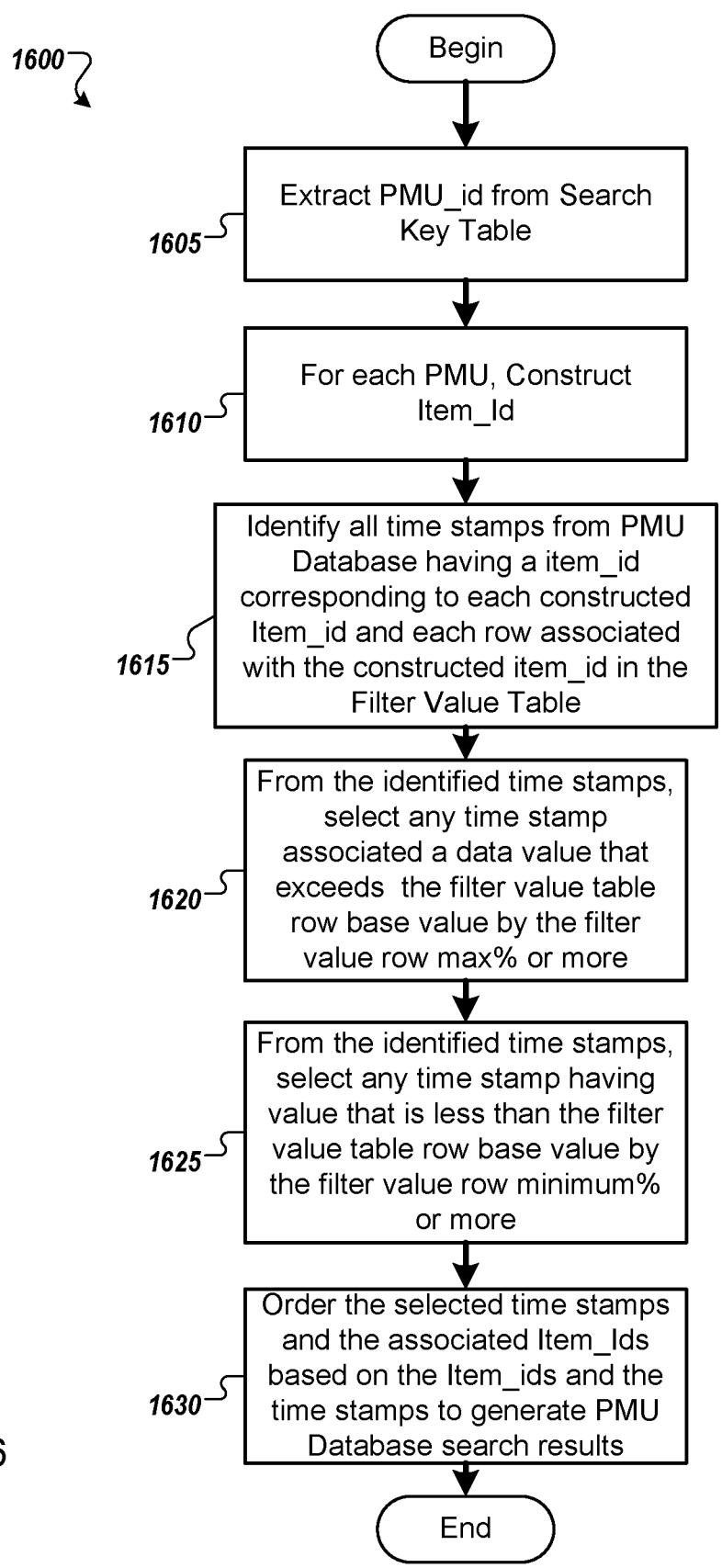
FIG. 16 illustrates a process for identifying outliers present in a search key data table extracted from the PMU Database in accordance with an example implementation.

FIG. 15 illustrates a process flow 1500 for identifying the historical event from a PMU database in accordance with an example implementation. At 1505, an outlier search is performed to identify outliers in the PMU database that may be indicative of candidate events to be identified as the historical event. FIG. 16 discussed below illustrates an example process for performing an outlier search in the PMU database.

Figure 17:
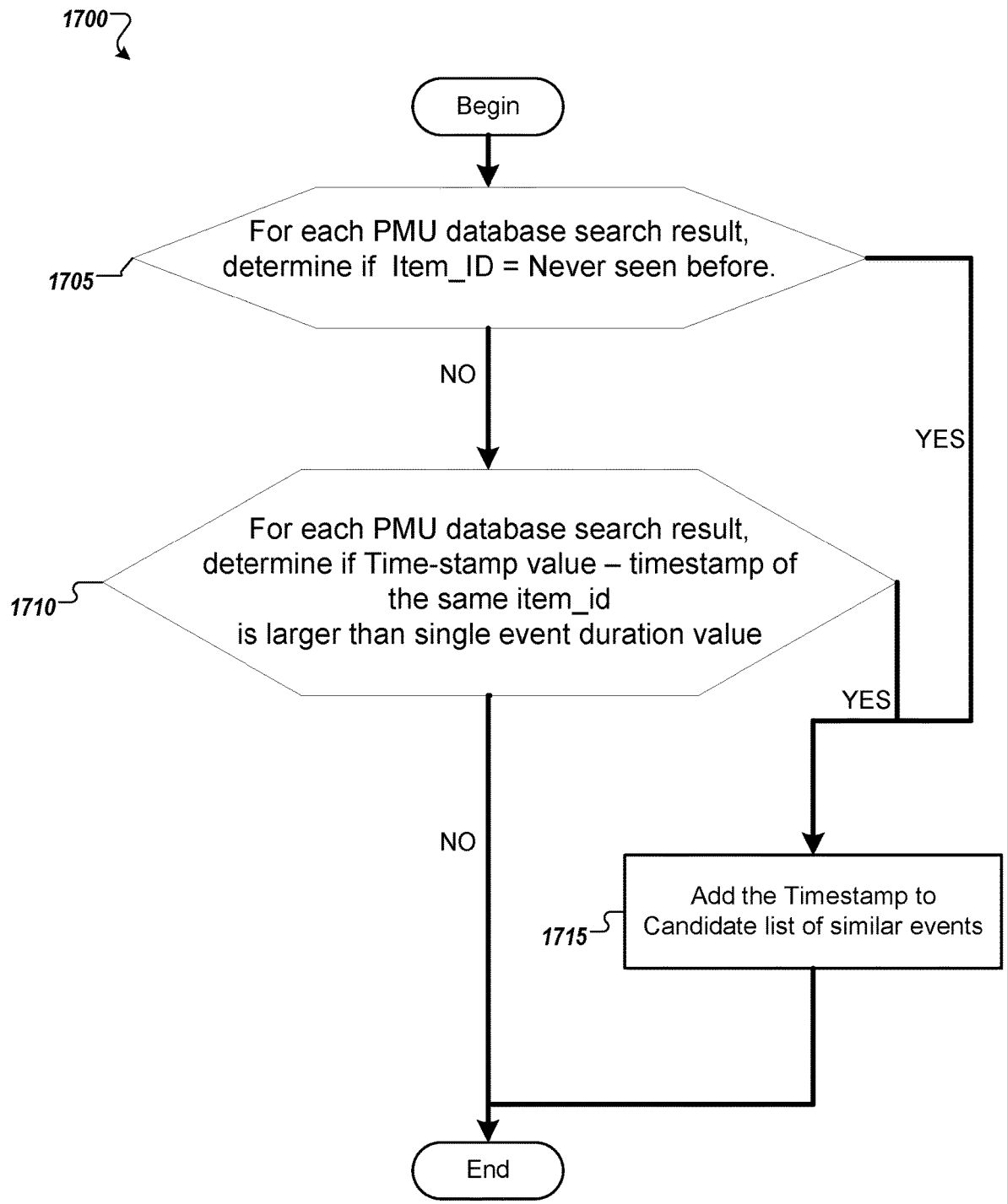
FIG. 17 illustrates a process for recognizing single events in accordance with an example implementation.
Figure 18:
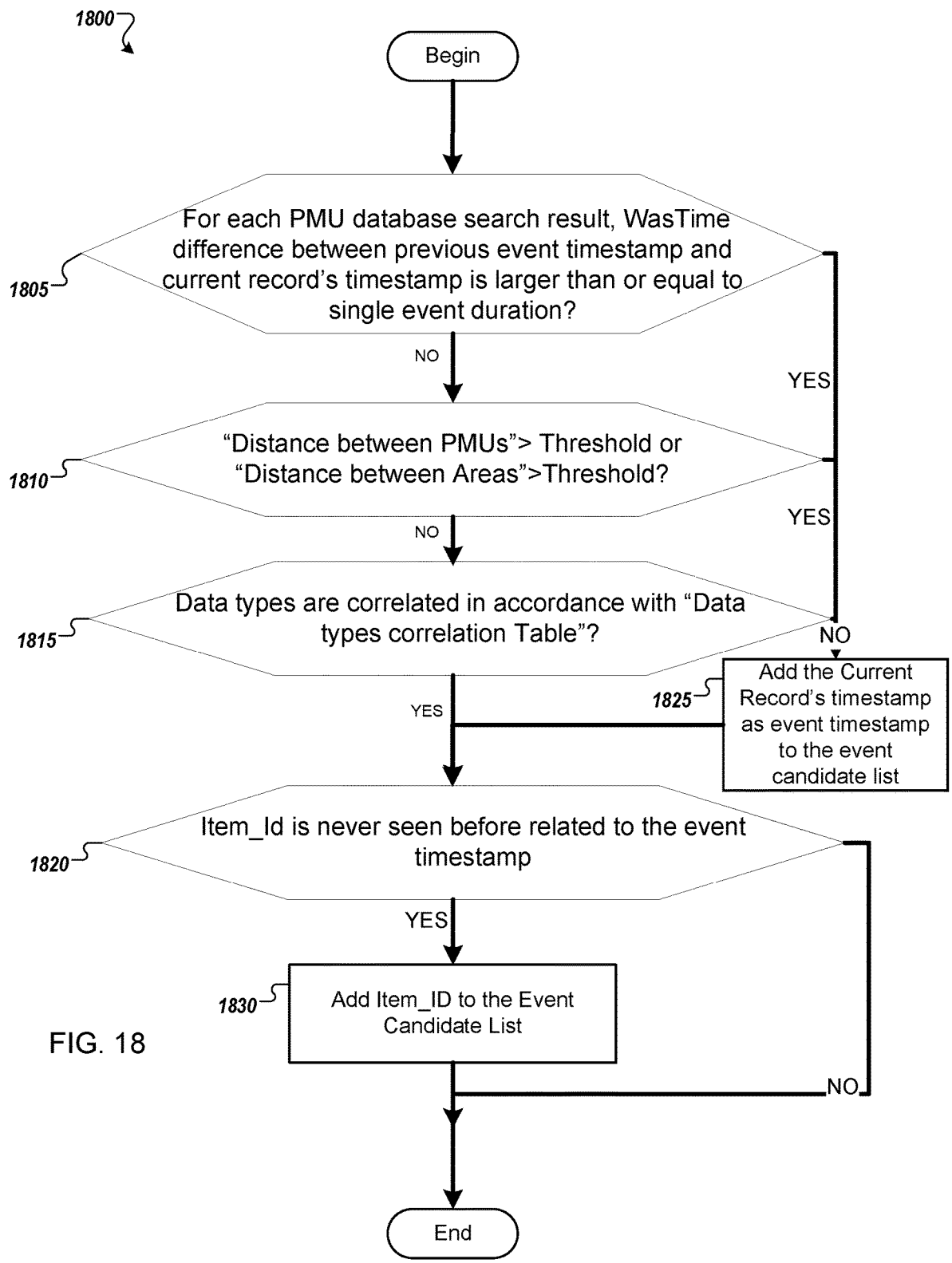
FIG. 18 illustrates another process for recognizing single events in accordance with an example implementation.

After the outlier search has been performed, a single event recognition process may be performed at 1510 to determine if the outliers are indicative of a candidate event to be identified as the historical event. FIGS. 17 and 18 discussed below illustrate example implementations of single event detection processes. The output of the single event recognition process may be a list of candidate events. By performing the outlier search and the single event detection processes, similar historical events can be extracted from the PMU database in a few seconds. Conventional historical event detection processes relying on feature extraction have required nearly five years to identify similar historical events making real-time use of historical event data infeasible.

Figure 19:
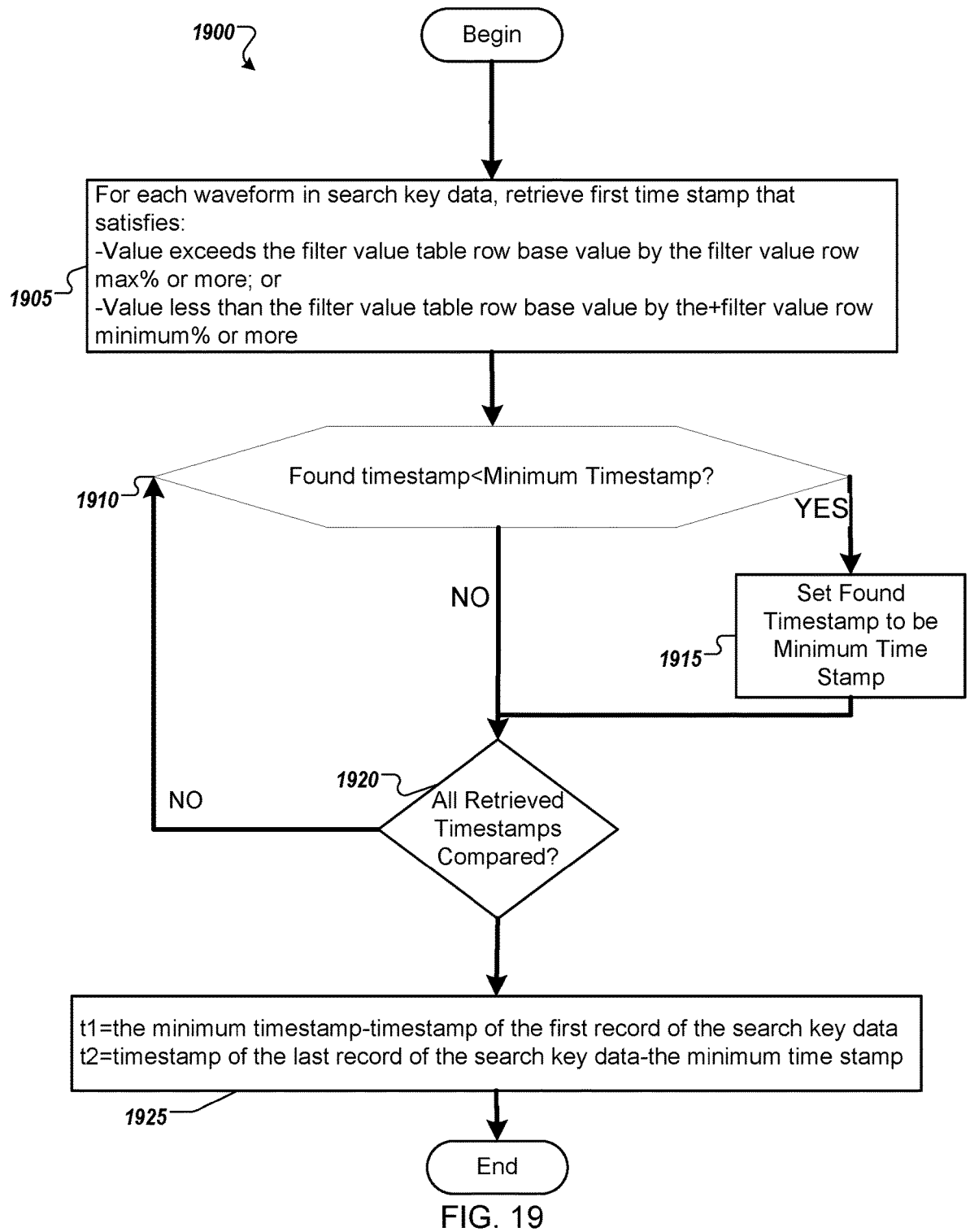
FIG. 19 illustrates a process for calculating a time duration preceding an occurring event and a time duration following an occurring event in accordance with an example implementation.

After the single event recognition process, a waveform correlation process may be performed to calculate a similarity between each candidate event on the list of candidate events and the occurring event. FIG. 19 illustrates an example implementation of a waveform correlation process. Once the similarity between each candidate event is determined, the candidate event having the greatest similarity may be identified, the process 1500 may end. When the process 1500 ends, the candidate event having the greatest similarity may be used in 1415 of process 1400 to correlate and display a comparison between the occurring event and the identified historical event, along with the historic log of actions taken in response to the historic event as discussed above.

FIG. 16 illustrates a process 1600 for identifying outliers present in a search key data table extracted from the PMU Database in accordance with an example implementation.

FIG. 8 discussed above illustrates an example implementation of a search key data table 800 that could be used in the process 1600. The search key data illustrated in the search key data table 800 may be received data associated with the occurring event.

At 1605, each unique PMU_id (e.g., column 810) is extracted from the search key data table 800. At 1610, each extracted PMU_id from the search key data table 800 is used to construct an Item_id string including the PMU_Id and the measured quantity (e.g., Frequency and voltage) illustrated in the search key data. For example, constructed Item_ids may include: PMU1-voltage, PMU1-frequency, PMU2-voltage, and PMU2-frequency.

After the Item_ids are constructed from the search key data, all time stamps in a PMU database (e.g., table 500 illustrated in FIG. 5) having an Item_id corresponding to the constructed Item_ids is identified at 1615. The row of the filter value table (e.g., table 600 of FIG. 6) associated with the constructed Item_ids may also be identified in 1615.

At 1620, the data value (e.g., Column 510 of table 5) associated with the identified timestamps is compared to base value (Column 620 of table 600) of the identified filter value table row to determine if the data value exceeds the base value by more than the maximum percentage (e.g., Max %, column 615 of table 600) of the filter value table. Any timestamps associated with data values exceeding the base value by more than the maximum percentage (e.g., data value>base value+(base value*Max %/100) are selected to be returned as PMU database search results.

As illustrated in FIGS. 1-3 discussed above, the frequency and voltage data are relative constant during normal operation. Thus, the data values associated with voltage or frequency may be used in the process 1600 because these values tend to remain constant unless an event has occurred. Thus, outliers in voltage or frequency may be correlated to potential events. Conversely, power data values, and other measured values (e.g., current, angle, ROCOF) etc.) can fluctuate widely during normal operation, making it difficult to detect outliers indicative of events in power data or other measured data values. Thus, power data values, and other measured values (e.g., current, angle, ROCOF) may not be used in the process 1600.

At 1625, the data value (e.g., Column 510 of table 5) associated with the identified timestamps is also compared to base value (Column 620 of table 600) of the identified filter value table row to determine if the data value is less than the base value by more than the minimum percentage (e.g., Min %, column 610 of table 600) of the filter value table. Any timestamps associated with data values less than the base value by more than the minimum percentage (e.g., data value<base value−(base value*Min %/100) are also selected to be returned as PMU database search results. Again, the data values associated with voltage or frequency are used because these values tend remain constant unless an event has occurred and thus outliers in voltage or frequency can be correlated to potential events.

At 1630, the selected timestamps and the associated Item_ids are sorted based on Item_id and ordered based on the timestamp order to produce PMU database search results. After the selected timestamps and associated Item_ids are sorted and ordered at 1630, the process 1600 ends. After the process 1600 ends, the produced PMU database search results may be used for single event recognition processes 1700, 1800 discussed below with respect to FIGS. 17 and 18.

FIG. 17 illustrates a process 1700 for recognizing single events in accordance with an example implementation. The process 1700 uses the produced PMU database search results from 1630 of process 1600 of FIG. 16 discussed above to recognize single events as candidates for comparison to the occurring event that was detected. At 1705, each record identified in the PMU database search results is examined to determine whether the Item_id has been encountered before. If a PMU database search result includes an Item_id that has not been encountered before (YES at 1705), the timestamp associated with the search result is added to a candidate list of similar events at 1715 and the process 1700 ends for that PMU database search result.

Conversely, if a PMU database search result includes an Item_id that has been encountered before (NO at 1705), each record identified in the PMU database search results is examined to determine whether the difference between the timestamp value associated with the PMU database search result and a timestamp value associated with a previous occurrence of the Item_id is greater than a defined single event duration value (e.g., the single event duration value of column 705 of table 700 of FIG. 7) at 1710. If the difference between the timestamp value associated with a PMU database search result and a timestamp value associated with a previous occurrence of the Item_id is greater than a defined single event duration value (YES at 1710), the timestamp associated with the search result is added to a candidate list of similar events at 1715 and the process 1700 ends for that PMU database search result.

Conversely, if the difference between the timestamp value associated with a PMU database search result and a timestamp value associated with a previous occurrence of the Item_id is not greater than a defined single event duration value (NO at 1710), the process 1700 ends for that PMU database search result without the PMU database search result being added to the candidate list of similar events.

The process 1700 may produce a candidate event list such as the candidate event table 1200 illustrated in FIG. 12 having only a single Item_id in each row of the table 1200.

FIG. 18 illustrates another process 1800 for recognizing single events in accordance with an example implementation. The process 1800 uses the produced PMU database search results from 1630 of process 1600 of FIG. 16 discussed above to recognize single events as candidates for comparison to the occurring event that was detected. At 1805, each record identified in the PMU database search results is examined to determine whether the difference between the timestamp value associated with the PMU database search result and a timestamp value associated with a previous event timestamp and the current record time stamp is greater than or equal to a defined single event duration value (e.g., the single event duration value of column 705 of table 700 of FIG. 7). If the difference between the timestamp value associated with a PMU database search result and a timestamp value associated with a previous event time stamp is greater than the defined single event duration value (YES at 1805), the timestamp associated with the current search result record is added as an event timestamp to the event candidate list of similar events at 1825.

After the timestamp is added to the event candidate list, a determination is made whether the Item_id associated with the current search result has been encountered before at 1820. If the current PMU database search result includes an Item_id that has not been encountered before (YES at 1820), the item_id associated with the search result is also added to the candidate list of similar events at 1830 and the process 1800 ends for that PMU database search result. Conversely, if the current PMU database search result includes an Item_id that has been encountered before (NO at 1820), the process 1800 ends for that PMU database search result without the Item_id associated with the PMU database search result being added to the candidate list of similar events.

Returning to 1805, if the difference between the timestamp value associated with a current PMU database search result and a timestamp value associated with a previous event is not greater than or equal to the defined single event duration value (NO at 1805), the process 1800 continues to 1810. At 1810, a determination is made whether a distance between a PMU associated with the search result and a PMU associated with previous event exceeds a threshold, or whether a distance between an area associated with the search result and an area associated with a previous event exceeds a threshold. The distances between PMUs may be determined based on a stored table (e.g., table 900 in FIG. 9). The distances between areas may also be determined based on a stored table (e.g., table 1000 in FIG. 10). The threshold values used may be user defined or system defined or may be dynamically adjusted based on the characteristics of the occurring event.

If either the distance between a PMU associated with the search result and a PMU associated with a previous event, or a distance between an area associated with the search result and an area associated with a previous event exceeds the threshold (YES at 1810), the timestamp associated with the current search result record is added as an event timestamp to the event candidate list of similar events at 1825.

After the timestamp is added to the event candidate list, a determination is made whether the Item_id associated with current search result has been encountered before at 1820. If the current PMU database search result includes an Item_id that has not been encountered before (YES at 1820), the item_id associated with the search result is also added to the candidate list of similar events at 1830 and the process 1800 ends for that PMU database search result. Conversely, if the current PMU database search result includes an Item_id that has been encountered before (NO at 1820), the process 1800 ends for that PMU database search result without the Item_id associated with the PMU database search result being added to the candidate list of similar events.

Returning to 1810, if neither the distance between a PMU associated with the search result and a PMU associated with a previous event, nor a distance between an area associated with the search result and an area associated with a previous event exceeds the threshold (NO at 1810), the process 1800 continues to 1815. At 1815, the data type associated with the current search result is compared to the data type associated with a previous event to determine if the data types are correlated to each other based on a data type correlation table (e.g., Table 1100 of FIG. 11). If the data type associated with the current search result is not correlated to the data type of a previous event, based on the data type correlation table, (NO at 1815), the timestamp associated with the current search result record is added as an event timestamp to the event candidate list of similar events at 1825.

After the timestamp is added to the event candidate list, a determination is made whether the Item_id associated with current search result has been encountered before at 1820. If the current PMU database search result includes an Item_id that has not been encountered before (YES at 1820), the item_id associated with the search result is also added to the candidate list of similar events at 1830 and the process 1800 ends for that PMU database search result. Conversely, if the current PMU database search result includes an Item_id that has been encountered before (NO at 1820), the process 1800 ends for that PMU database search result without the Item_id associated with the PMU database search result being added to the candidate list of similar events.

Returning to 1815, if the data type associated with the current search result is correlated to the data type of a previous event, based on the data type correlation table, (YES at 1815), a determination is made whether the Item_id associated with current search result has been encountered before at 1820. If the current PMU database search result includes an Item_id that has not been encountered before (YES at 1820), the item_id associated with the search result is also added to the candidate list of similar events at 1830 and the process 1800 ends for that PMU database search result. Conversely, if the current PMU database search result includes an Item_id that has been encountered before (NO at 1820), the process 1800 ends for that PMU database search result without the Item_id associated with the PMU database search result being added to the candidate list of similar events.

The process 1800 may produce a candidate event list such as the candidate event table 1300 illustrated in FIG. 13 having multiple Item_ids associated with one or more of the timestamps in each row of the table 1300.

FIG. 19 illustrates a process 1900 for calculating a time duration ($t_1$) preceding an occurring event and a time duration ($t_2$) following an occurring event to be used to define a time window of historic PMU data for comparison to a current window containing the occurring event in accordance with an example implementation. The process 1900 uses the search key data (e.g., table 800 of FIG. 8) to determine the time durations ($t_1$ & $t_2$) preceding and following the occurring event so that a similarly sized window of historical PMU data can be extracted to allow a waveform similarity determination to be performed.

Figure 20:
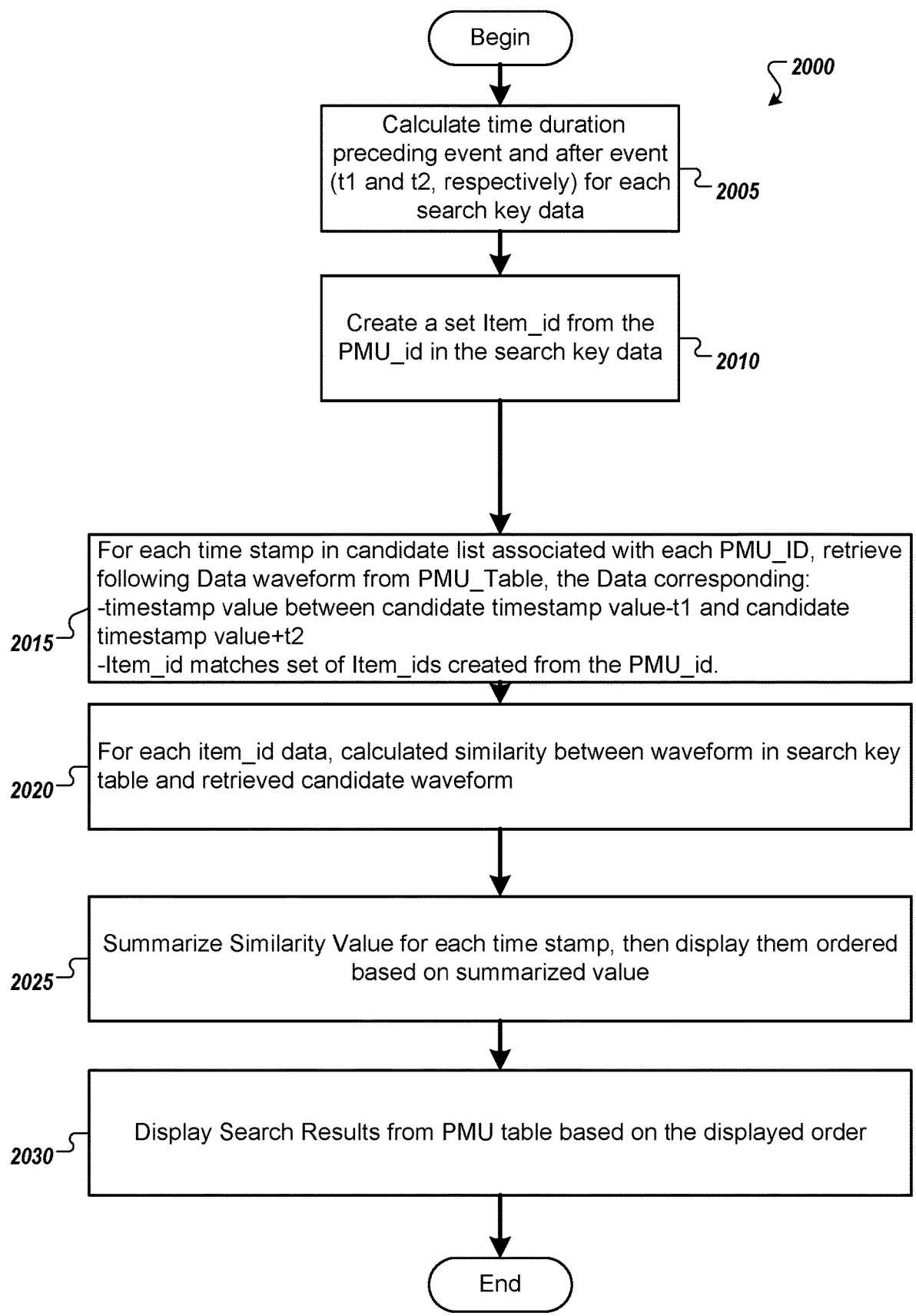
FIG. 20 illustrates a process for performing a waveform similarity correlation in accordance with an example implementation.

In the process 1900, each time series data sets associated with each PMU in the key search data is considered a waveform to be used for a waveform similarity determination to be performed in the process 2000 of FIG. 20. For each waveform contained in the search key data, the first occurring timestamp associated with a data value meeting one of two conditions is retrieved at 1905. The two conditions considered in 1905 are whether 1) the value exceeds an associated filter table base value (e.g., Column 620 of table 600 of FIG. 6) by the Max % (e.g., Column 615 of table 600 of FIG. 6) or 2) that is less than an associated filter table base value (e.g., Column 620 of table 600 of FIG. 6) by the min % (e.g., Column 610 of table 600 of FIG. 6).

After one or more timestamps are retrieved in 1905, the retrieved timestamp values are compared to determine the minimum timestamp value in 1910-1920. At 1910, a determination is made whether a just found timestamp is less than a minimum timestamp. If the just found timestamp is less than the minimum timestamp (YES at 1910), the just found timestamp is set as the minimum timestamp at 1915 and the process 1900 proceeds to 1925. Conversely, if the just found time stamp is not less than the minimum timestamp (NO at 1910), the process 1900 proceeds to 1925.

At 1925, a determination is made whether all retrieved timestamps have been compared to the minimum timestamp. If not all retrieved timestamps have been compared (NO at 1925), the process 1900 returns to 1910 to compare a new just found timestamp with the minimum timestamp. Conversely, if all retrieved timestamps have been compared to the minimum timestamp, the process 1900 continues to 1925.

At 1925, values of time durations ($t_1$ & $t_2$) preceding and following the occurring event are calculated. Time duration preceding the occurring event ($t_1$) may be calculated by determining a difference between the minimum timestamp and the timestamp of the first record of the search key data. The time duration following the occurring event ($t_2$) may be calculated by determining a difference between the timestamp of the last record of the search key data and the minimum timestamp. After the values of time durations ($t_1$ & $t_2$) preceding and following the occurring event are calculated, the process 1900 ends.

FIG. 20 illustrates a process 2000 for performing a waveform similarity correlation between the candidate events identified in the processes of either FIGS. 17 and 18 and the search key data (e.g., Table 500 of FIG. 5) representative of an occurring event in accordance with an example implementation.

At 2005, a time duration preceding an occurring event ($t_1$) and time duration after the occurring event ($t_2$) are calculated for the search key data using the process 1900 discussed above with respect to FIG. 19.

At 2010, a set of item_ids is created from the PMU_id in the search key data. The Item_ids may be created by combining the PMU_id identified in the search key data with each data type included in the search key data (e.g., Frequency, voltage, current, power, angle, etc.). As discussed above, frequency and voltage were used for event detection. However, other data types (e.g., current, power, angle, etc.) may be used in the waveform correlation to improve a similarity calculation accuracy.

For each PMU_id and for each time stamp in the candidate list of similar events, a data waveform is retrieved from the PMU table (e.g., table 500 of FIG. 5) at 2015. The retrieved data waveform is made up of any data having an Item_id that matches the Item_ids created in 2010 and having a timestamp value greater than the candidate timestamp-$t_1$ and less than the candidate timestamp+$t_2$. Thus, a window of data surrounding each candidate event is retrieved that is of the same size as the window of data provided by the search key data. Additionally, the candidate event and the occurring event should be temporally aligned within the respective data windows (e.g., the candidate event and the occurring event are preceded by equal time durations within their respective data windows).

At 2020, a similarity between the waveform in the search key table and each retrieved candidate waveform is calculated for each Item_id. The similarity may be calculated using the formula:

$$\text{Similarity} = \sqrt{w_v \Delta V^2 + w_f \Delta F^2 + w_p \Delta P^2}/n-1 \quad (1)$$

where:
$w_v$, $w_f$, $w_p$=weight factors associated with the voltage, frequency, and power respectively;
$\Delta V$, $\Delta F$, $\Delta P$=difference of between the search key table waveform, and the retrieved candidate waveform in the respective voltage, frequency and power values; and
n=the number data points in the waveform.

The degree of similarity between the search key table waveform and the retrieved waveform is inversely proportional to the value calculated using the formula (1) illustrated above (e.g., closer to 0 means high similarity).

At 2025, the calculated similarity values for each candidate timestamp are summarized and displayed in an ordered list. After the calculated similarity values are displayed in the ordered list, the search results having most similarity (e.g., the lowest similarity value) may be displayed as a correlated wave form at 2030 and the process 2000 ends. FIG. 22 illustrates an example implementation of displayed search results.

Figure 21:
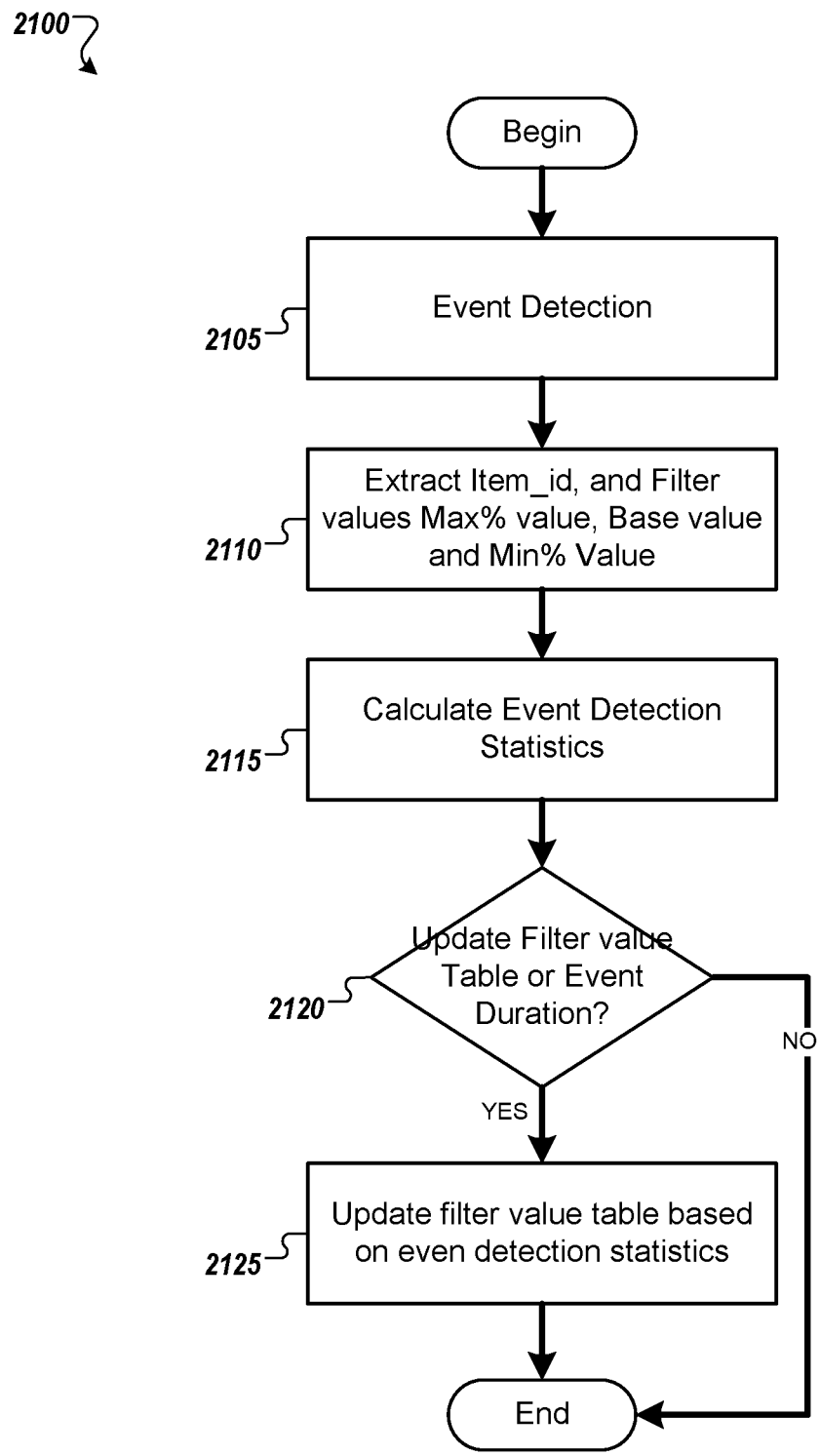
FIG. 21 illustrates a process for updating filter table values in accordance with an example implementation.

FIG. 21 illustrates a process 2100 for updating filter table values (e.g. table 600 of FIG. 6) based on a detected ongoing event or a detected historical event recognized during the processes discussed above. At 2105, an event is detected based on detection of outliers in measured data values received from a PMU. Outliers may be detected using, for example, the process 1600 of FIG. 16. After an event is detected, an Item_id, and filer values (e.g. Max % value, Base value, and Min % value) associated with the Item_id, are extracted at 2110. Based on the detected event, event detection statistics are calculated at 2115. The event detection statistics may include event duration, event frequency, max event data value, minimum event data value, average event data value, and average difference between event data value and filter value base value.

At 2120, the event detection statistics are compared to the filter table values and the stored minimum event duration value (e.g., column 705 of table 700 of FIG. 7) to determine if the filter table values and stored minimum event duration value should be updated using machine learning. For example, the calculated event duration is compared to stored minimum event duration value to determine if the stored minimum event duration captures the calculated event. Similarly, the max event data value, minimum event data value, and the average event data values may be evaluated to determine if the e.g. Max % value, Base value, and Min % values should be updated.

If the filter value table (e.g., table 600 of FIG. 6) or minimum event duration (e.g., column 705 of table 700 of FIG. 7 require an update (YES at 2120), new filter table values or minimum event duration values are updated at 2125 and the process 2100 ends. Conversely, if the filter value table (e.g., table 600 of FIG. 6) or minimum event duration (e.g., column 705 of table 700 of FIG. 7) do not require an update (NO at 2120), the process 2100 ends without an update.

FIG. 22 illustrates a user interface (UI) 2200 displaying data relating to an occurring event and a retrieved historical event in accordance with an example implementation. As illustrated, the UI 2200 includes a graphical display 2205 of waveforms representative of an occurring event. The UI 2200 also includes a graphical display 2210 of the waveforms associated with the candidate event having the highest degree of similarity using the process 2000 of FIG. 20. The UI 2200 may also include an ordered listing 2215 of other candidate events that were identified during either of the processes 1700, 1800 of FIGS. 17 and 18. Further, the UI 2200 also includes a display of a historical action log 2220 of the actions taken during the candidate event associated with waveforms displayed at 2210. Based on the displayed historical action log 2220, an operator can determine actions that should be taken in response to the occurring event. The UI 22200 may also include display parameters 2225 and 2230 indicative of the current start time and end time of the displayed waveforms 2205 representative of the occurring event.

Figure 23:
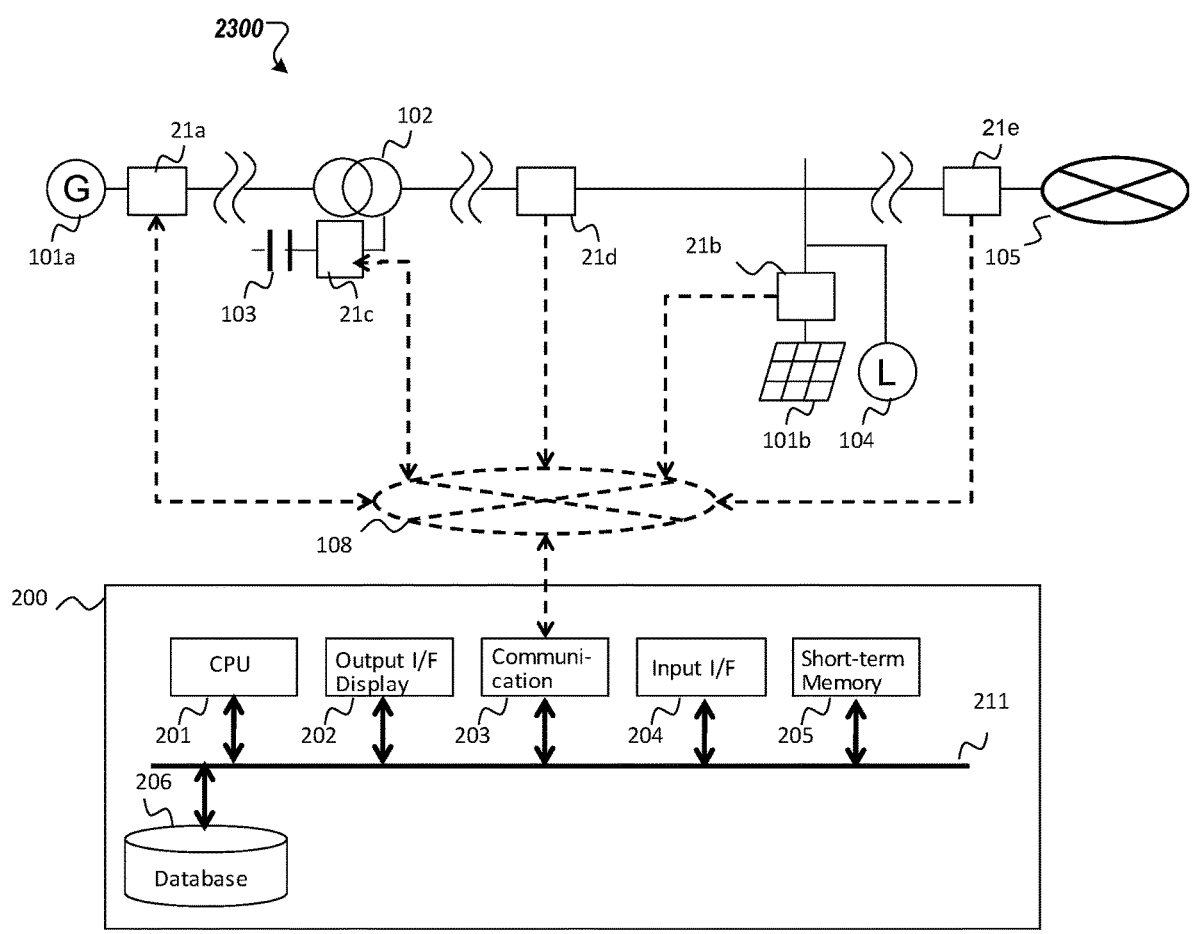
FIG. 23 illustrates an example system upon which example implementations may be applied.

FIG. 23 illustrates an example system 2300 upon which example implementations may be applied. The system 2300 can include PMUs 21a, 21b, 21c, 21d, 21e distributed throughout the system 2300. Some PMUs 21a, 21b may connect to monitor generators 101a, 101b (e.g., hydroelectric generators, solar generators, and fossil fuel based generators). Other PMUs 21c may be connected to monitor transformers 102 and regulators 103. Still other PMUs 21d may be located to monitor transmission lines, and electrical buses. Still other PMUs 21b, 21e may be positioned to monitor load devices 104 or local distribution power grids 105.

Each of the PMUs may be connected to a similar event search system 200 by a communication network 108. Similar event search system 200 is an apparatus that may be in the form of any system in accordance with a desired implementation (e.g., computer, data center, etc.). The similar event search system 200 may be configured to manage a plurality of PMUs in a power system, and can include a physical central processing unit (CPU) 201, database 206, output interface (I/F) 202, communication processor 203, input I/F 204, and short term memory 205 (e.g. cache) connected by a communications bus 211. The CPU 201 may execute one or more flows as illustrated in FIGS. 14-21. The Database 206 may be in the form of one or more storage devices configured to manage data measurements provided by PMUs. The Output I/F 202 provides external output to the operator of the similar event search system 200, such as displays, meter gauges, and so on. The communication processor 703 can function as an interface for receiving data from the PMUs through communication network 108 and conducting initial processing. The Input I/F 204 provides interfaces for input from the operator, including keyboards, touchscreens, mouse and so on. The Short term memory 205 can function as a cache for temporary storage of data streamed from PMUs.

In example implementations, the database 206 may be configured to store measurement data from the one or more PMUs, the measurement data comprising first measurement data including at least one of frequency data and voltage data, and second measurement data such as the PMU data illustrated in FIGS. 4 and 5. The CPU 201 may be configured to, for an instance of the first measurement data being outside a threshold (such as the values illustrated in FIG. 6) identify a corresponding PMU from the one or more PMUs associated with the instance; and capture, based on the instance, a first window of the first measurement data and the second measurement data of the corresponding PMU. The CPU 201 may also be configured to process incoming data from the one or more PMUs. Further, the CPU 201 may be configured to for a second window of the incoming data corresponding to the first window, retrieve the first measurement data and the second measurement data corresponding with the instance; and conduct a comparison between the first window of the first measurement data and the second measurement data, and the second window of the incoming data as illustrated, for example, in the flow of FIG. 15.

In example implementations, the CPU 201 may also be configured to, for each of a plurality of instances of the first measurement data being outside the threshold (such as the values illustrated in FIG. 6), to identify the corresponding PMU from the one or more PMUs associated with each of the plurality of instances, capture a plurality of first windows of the first measurement data and the second measurement data from the corresponding PMU associated with each of the plurality of instances, each of the plurality of the first windows corresponding with one of the plurality of instances, conduct a comparison between each of the plurality of the first windows and the second window of the incoming data, and select a window of the first measurement data and the second measurement data from the plurality of windows based on the comparison between each of the plurality of the first windows with respect to the second window of the incoming data as illustrated, for example, in the flows of FIGS. 16-20.

The CPU 201 may also be configured to combine two or more instances of the plurality of instances of the first measurement data being outside the threshold into a single instance, based on the two or more instances occurring within a time duration less than a minimum duration (such as the minimum event duration illustrated in column 705 of FIG. 7) as illustrated, for example, in the flows of FIG. 17.

The CPU 201 may also be configured to identify a first PMU corresponding with a first instance selected from the plurality of instances, and a second PMU corresponding with a second instance selected from the plurality of instances; and combine the first instance and the second instance into a single instance based on a distance between the first PMU and the second PMU being less than a distance threshold as illustrated, for example, in the flows of FIG. 18.

In example implementations, the output I/F 202 may be configured to display information to a user or operation. Further, the CPU 201 may also be configured control the output I/F 202 to display a user interface (UI), such as the UI illustrated in FIG. 22. The UI may comprise a graphical representation of the second window of the incoming data; and a graphical representation of the window of first measurement data and the second measurement data selected from the plurality of windows as illustrated, for example, in the flow of FIG. 20.

The CPU 201 may further be configured to capture a log of actions associated with a system user in response to each instance during each of the plurality of windows; and control the display device to display a log of actions taken in response to the instance corresponding to the window of first measurement data and the second measurement data selected from the plurality of windows as illustrated, for example, in the flows of FIGS. 14 and 20.

The CPU 201 is further configured to conduct the comparison between the first window of the first measurement data and the second measurement data, and the second window of the incoming data, by calculating a similarity value based on differences in data values between the first measurement data and the second measurement data, and the incoming data as illustrated, for example, in the flow of FIG. 20.

The CPU 201 is further configured to calculate the threshold based on an average value of the first measurement data and a percentage factor calculated based on previous instances of the first measurement data exceeding the threshold as illustrated, for example, in the flow of FIG. 21.

Figure 24:
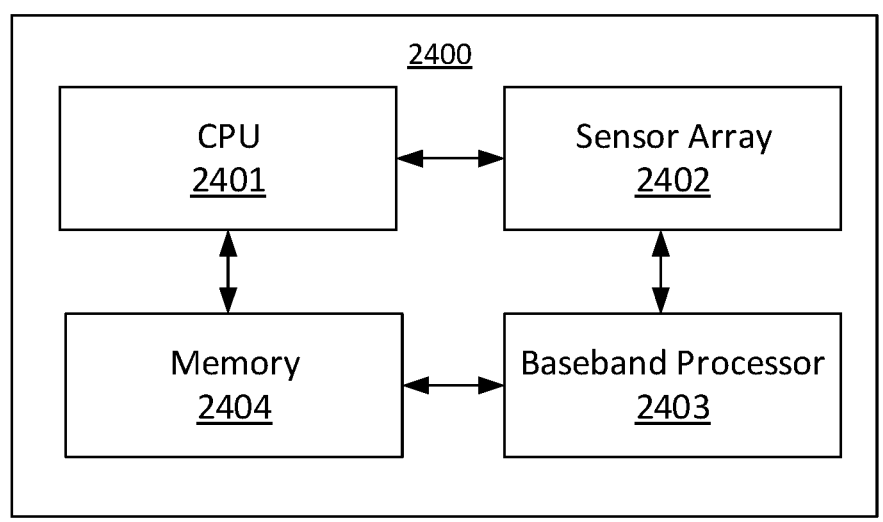
FIG. 24 illustrates a PMU in accordance with an example implementation.

FIG. 24 illustrates a PMU 2400 in accordance with an example implementation. PMU 2400 may include a CPU 2401, memory 2404, sensor array 2402, and baseband processor 2403. Data from sensor array 2402 is streamed to memory 2404 and processed by CPU 2401 to be prepared in a format for use by the receiving apparatus such as similar event search system 200 of FIG. 23. Processed data is then transmitted to the receiving apparatus by baseband processor 2403, which can be implemented as streaming data or batch data.

Some portions of the detailed description are presented in terms of algorithms and symbolic representations of operations within a computer. These algorithmic descriptions and symbolic representations are the means used by those skilled in the data processing arts to convey the essence of their innovations to others skilled in the art. An algorithm is a series of defined steps leading to a desired end state or result. In example implementations, the steps carried out require physical manipulations of tangible quantities for achieving a tangible result.

Unless specifically stated otherwise, as apparent from the discussion, it is appreciated that throughout the description, discussions utilizing terms such as "processing," "computing," "calculating," "determining," "displaying," or the like, can include the actions and processes of a computer system or other information processing device that manipulates and transforms data represented as physical (electronic) quantities within the computer system's registers and memories into other data similarly represented as physical quantities within the computer system's memories or registers or other information storage, transmission or display devices.

Example implementations may also relate to an apparatus for performing the operations herein. This apparatus may be specially constructed for the required purposes, or it may include one or more general-purpose computers selectively activated or reconfigured by one or more computer programs. Such computer programs may be stored in a computer readable medium, such as a computer-readable storage medium or a computer-readable signal medium. A computer-readable storage medium may involve tangible mediums such as, but not limited to optical disks, magnetic disks, read-only memories, random access memories, solid state devices and drives, or any other types of tangible or non-transitory media suitable for storing electronic information. A computer readable signal medium may include mediums such as carrier waves. The algorithms and displays presented herein are not inherently related to any particular computer or other apparatus. Computer programs can involve pure software implementations that involve instructions that perform the operations of the desired implementation.

Various general-purpose systems may be used with programs and modules in accordance with the examples herein, or it may prove convenient to construct a more specialized apparatus to perform desired method steps. In addition, the example implementations are not described with reference to any particular programming language. It can be appreciated that a variety of programming languages may be used to implement the teachings of the example implementations as described herein. The instructions of the programming language(s) may be executed by one or more processing devices, e.g., central processing units (CPUs), processors, or controllers.

As is known in the art, the operations described above can be performed by hardware, software, or some combination of software and hardware. Various aspects of the example implementations may be implemented using circuits and logic devices (hardware), while other aspects may be implemented using instructions stored on a machine-readable medium (software), which if executed by a processor, would cause the processor to perform a method to carry out implementations of the present application. Further, some example implementations of the present application may be performed solely in hardware, whereas other example implementations may be performed solely in software. Moreover, the various functions described can be performed in a single unit, or can be spread across a number of components in any number of ways. When performed by software, the methods may be executed by a processor, such as a general purpose computer, based on instructions stored on a computer-readable medium. If desired, the instructions can be stored on the medium in a compressed and/or encrypted format.

Moreover, other implementations of the present application may be apparent to those skilled in the art from consideration of the specification and practice of the teachings of the present application. Various aspects and/or components of the described example implementations may be used singly or in any combination. It is intended that the specification and example implementations be considered as examples only, with the true scope and spirit of the present application being indicated by the following claims.

What is claimed is:

1. A system configured to manage one or more phasor measurement units (PMUs), the system comprising:
   a memory configured to store measurement data from the one or more PMUs, the measurement data comprising first measurement data including at least one of frequency data and voltage data, and second measurement data; and
   a processor configured to:
      for an instance of the first measurement data being outside a threshold:
         identify a corresponding PMU from the one or more PMUs associated with the instance; and
         capture, based on the instance, a first window of the first measurement data and the second measurement data of the corresponding PMU;
      process incoming data from the one or more PMUs;
      for a second window of the incoming data corresponding to the first window,
         retrieve the first measurement data and the second measurement data corresponding with the instance; and
         conduct a comparison between the first window of the first measurement data and the second measurement data, and the second window of the incoming data.

2. The system of claim 1, wherein the processor is configured, for each of a plurality of instances of the first measurement data being outside the threshold, to:
   identify the corresponding PMU from the one or more PMUs associated with each of the plurality of instances;
   capture a plurality of first windows of the first measurement data and the second measurement data from the corresponding PMU associated with each of the plurality of instances, each of the plurality of the first windows corresponding with one of the plurality of instances;
   conduct a comparison between each of the plurality of the first windows and the second window of the incoming data; and
   select a window of the first measurement data and the second measurement data from the plurality of windows based on the comparison between each of the plurality of the first windows with respect to the second window of the incoming data.

3. The system of claim 2, wherein the processor is configured to combine two or more instances of the plurality of instances of the first measurement data being outside the threshold into a single instance, based on the two or more instances occurring within a time duration less than a minimum duration.

4. The system of claim 2, wherein the processor is configured to:
   identify a first PMU corresponding with a first instance selected from the plurality of instances, and a second PMU corresponding with a second instance selected from the plurality of instances; and
   combine the first instance and the second instance into a single instance based on a distance between the first PMU and the second PMU being less than a distance threshold.

5. The system of claim 2, further comprising a display device,
   wherein the processor is configured to control the display device to display a user interface (UI), the UI comprising:
      a graphical representation of the second window of the incoming data; and
      a graphical representation of the window of first measurement data and the second measurement data selected from the plurality of windows.

6. The system of claim 5, wherein the processor is configured to capture a log of actions associated with a system user in response to each instance during each of the plurality of windows; and
   control the display device to display a log of actions taken in response to the instance corresponding to the window of first measurement data and the second measurement data selected from the plurality of windows.

7. The system of claim 1, wherein the processor is configured to conduct the comparison between the first window of the first measurement data and the second measurement data, and the second window of the incoming data, by calculating a similarity value based on differences in data values between the first measurement data and the second measurement data, and the incoming data.

8. The system of claim 1, wherein the processor is configured to calculate the threshold based on an average value of the first measurement data and a percentage factor calculated based on previous instances of the first measurement data exceeding the threshold.

9. A method of managing one or more phasor measurement units (PMUs), the method comprising:
   storing measurement data from the one or more PMUs, the measurement data comprising first measurement data including at least one of frequency data and voltage data, and second measurement data; and
   for an instance of the first measurement data being outside a threshold:
      identifying a corresponding PMU from the one or more PMUs associated with the instance; and
      capturing, based on the instance, a first window of the first measurement data and the second measurement data of the corresponding PMU;
      processing incoming data from the one or more PMUs;
   for a second window of the incoming data corresponding to the first window,
      retrieving the first measurement data and the second measurement data corresponding with the instance; and
      conducting a comparison between the first window of the first measurement data and the second measurement data, and the second window of the incoming data.

10. The method of claim 9, further comprising, for each of a plurality of instances of the first measurement data being outside the threshold:
   identifying the corresponding PMU from the one or more PMUs associated with each of the plurality of instances;
   capturing a plurality of first windows of the first measurement data and the second measurement data from the corresponding PMU associated with each of the plurality of instances, each of the plurality of the first windows corresponding with one of the plurality of instances;

conducting a comparison between each of the plurality of the first windows and the second window of the incoming data; and selecting a window of the first measurement data and the second measurement data from the plurality of windows based on the comparison between each of the plurality of the first windows with respect to the second window of the incoming data.

11. The method of claim 10, further comprising combining two or more instances of the plurality of instances of the first measurement data being outside the threshold into a single instance, based on the two or more instances occurring within a time duration less than a minimum duration.

12. The method of claim 10, further comprising:

identifying a first PMU corresponding with a first instance selected from the plurality of instances and a second PMU corresponding with a second instance selected from the plurality of instances; and combining the first instance and the second instance into a single instance based on a distance between the first PMU and the second PMU being less than a distance threshold.

13. The method of claim 10, further comprising displaying a user interface (UI), the UI comprising:

a graphical representation of the second window of the incoming data; and a graphical representation of the window of first measurement data and the second measurement data selected from the plurality of windows.

14. The method of claim 13, further comprising capturing a log of actions associated with a system user in response to each instance during each of the plurality of windows; and displaying a log of actions taken in response to the instance corresponding to the window of first measurement data and the second measurement data selected from the plurality of windows.

15. A non-transitory computer readable medium, storing instructions for managing one or more phasor measurement units (PMUs), the instructions comprising:

storing measurement data from the one or more PMUs, the measurement data comprising first measurement data including at least one of frequency data and voltage data, and second measurement data; and for an instance of the first measurement data being outside a threshold:

identifying a corresponding PMU from the one or more PMUs associated with the instance; and capturing, based on the instance, a first window of the first measurement data and the second measurement data of the corresponding PMU;

processing incoming data from the one or more PMUs;

for a second window of the incoming data corresponding to the first window, retrieving the first measurement data and the second measurement data corresponding with the instance; and conducting a comparison between the first window of the first measurement data and the second measurement data and the second window of the incoming data.

* * * * *